(12) United States Patent
Achari et al.

(10) Patent No.: US 6,467,161 B2
(45) Date of Patent: Oct. 22, 2002

(54) METHOD FOR MAKING A CIRCUIT BOARD

(75) Inventors: Achyuta Achari, Canton; Brenda Joyce Nation, Troy, both of MI (US); Delin Li, San Jose, CA (US); Lakhi N. Goenka, Ann Arbor, MI (US); Richard Keith McMillan, Dearborn, MI (US); Vivek A. Jairazbhoy, Farmington Hills, MI (US)

(73) Assignee: Visteon Global Tech., Inc., Dearborn, MI (US)

( * ) Notice: Subject to any disclaimer, the term of this patent is extended or adjusted under 35 U.S.C. 154(b) by 2 days.

(21) Appl. No.: 09/812,989

(22) Filed: Mar. 20, 2001

(65) Prior Publication Data

US 2001/0040048 A1 Nov. 15, 2001

Related U.S. Application Data

(60) Provisional application No. 60/207,647, filed on May 26, 2000.

(51) Int. Cl.$^7$ .................................................. H05K 3/20
(52) U.S. Cl. ............................. 29/831; 29/846; 29/852; 29/830
(58) Field of Search ........................... 29/852, 830, 831, 29/840, 833, 846

(56) References Cited

U.S. PATENT DOCUMENTS

| 3,801,388 | A |   | 4/1974  | Akiyama et al. |        |
|-----------|---|---|---------|----------------|--------|
| 4,404,059 | A |   | 9/1983  | Livshits et al.|        |
| 4,704,791 | A | * | 11/1987 | Chellis et al. | 29/852 |
| 5,153,987 | A | * | 10/1992 | Takahashi et al.| 29/852 |
| 5,227,588 | A | * | 7/1993  | Schreiber et al.| 29/852 |
| 5,546,655 | A | * | 8/1996  | Feger et al.   | 29/852 |
| 5,738,797 | A |   | 4/1998  | Belke, Jr. et al.|      |

FOREIGN PATENT DOCUMENTS

| JP | 6-252559 | * | 9/1994 | 29/852 |
|----|----------|---|--------|--------|
| SU | 293311   | * | 3/1971 | 29/852 |
| SU | 218975   | * | 2/1974 | 29/852 |

* cited by examiner

*Primary Examiner*—Carl J. Arbes
(74) *Attorney, Agent, or Firm*—Visteon Global Tech., Inc.

(57) ABSTRACT

A method 10, 110 for making multi-layer electronic circuit boards 82, 148 having metallized apertures 18, 20, 118, 120 which may be selectively and electrically connected to a source of ground potential.

15 Claims, 12 Drawing Sheets

METHOD FOR MAKING A CIRCUIT BOARD

This application claims the benefit of Provisional Application No. 60/247,647, filed May 26, 2000.

FIELD OF THE INVENTION

The present invention relates to a circuit board and a method for making a circuit board and, more particularly, to a method for making a multi-layer electronic- circuit board having apertures which are formed through metal portions of the board and which may be selectively connected and/or detached from an electrical ground plane.

BACKGROUND OF THE INVENTION

Multi-layer circuit boards allow electronic and/or electrical components to selectively and operatively populate opposed top and bottom surfaces of each board (or other respective interior portions of each of the boards), thereby desirably allowing each of the electronic and/or electrical circuit boards to contain a relatively large amount of electronic components which efficiently and densely populate the respective boards. It is desirable to allow each of the components containing surfaces or portions of a created and/or formed electronic and/or electrical circuit board to communicate, thereby allowing the contained electronic components on each side of the board (or within certain interior portions of the board) to cooperatively and selectively form one or more desired electronic circuits. This communication may require the use of shared electrical ground planes, the transmittal of power and/or control type signals between each of the component containing surfaces or board portions, and/or the connection of components on each of the opposed surfaces and/or within and between certain of the interior portions and the top and/or bottom board surfaces.

This desired interconnection typically requires that one or more holes be drilled through each of the circuit boards, thereby physically creating at least one "through hole" or "via" lying between each of the opposed component containing surfaces and through the various interior circuit board portions. Such drilling is undesirable since it is relatively time consuming, costly, potentially causes damage to significant numbers of the formed electronic circuit boards requiring these circuit boards to be destroyed, and requires costly and inefficient electroless and/or electrolytic plating of the formed holes or "vias".

While some attempts have been made to obviate the need for such plating, such as by the use of a conductive epoxy within each of the drilled holes, these attempts have not produced reliable electrical interconnections and these produced interconnections are not typically adapted to allow the communication of electrical power signals between the board surfaces or to securely and reliably receive a component.

Further, it is desirable to form "air-bridges" or "crossover type circuits" upon one or more selected surfaces and/or within certain component containing portions of the formed circuit board in order to allow multiple levels of circuits and/or electrical interconnections to be formed upon a single board surface and/or within a certain component containing portion of the circuit board, thereby desirably increasing the amount of electronic circuits which may be created upon and/or within the created circuit board (e.g., increasing the density of the contained electronic circuitry).

These "air-bridges" or crossover circuits are typically formed by rather complicated, costly, and time consuming processes. The formed bridges and crossover circuits further do not typically and efficiently accommodate certain desirable circuit board interconnection processes, techniques, and/or methodologies such as and without limitation, the use of relatively heavy wire bonding (e.g., aluminum wire having a diameter of about five to about twenty millimeters) or the direct connection of components to a surface of the board.

There is therefore a need to provide a method for producing a multi-layer electronic circuit board which overcomes some or all of the previously delineated drawbacks and which selectively allows grounded and non-ground "vias" to be desirably and selectively formed.

SUMMARY OF THE INVENTION

It is a first object of the present invention to provide a method for producing a multi-layer electronic circuit board which overcomes some or all of the previously delineated drawbacks of prior multi-layer electronic circuit board forming methodologies and techniques.

It is a second object of the invention to provide a method for producing a multi-layer electronic circuit board which overcomes some or all of the previously delineated drawbacks of prior multi-layer electronic circuit board forming methodologies and techniques and which allows for the selective, efficient, and reliable formation of metallized apertures which allows for communication by and between various portions of the formed multi-layer electronic circuit board and which is further adapted to selectively and communicatively receive an electronic component.

It is a third object of the invention to provide a method for producing a multi-layer electronic circuit board which overcomes some or all of the previously delineated drawbacks of prior multi-layer electronic circuit board forming methodologies and techniques and which allows for the selective formation of metallized apertures which may be selectively connected or disconnected from a selectively formed electronic ground plane or bus.

According to a first aspect of the present invention a multi-layer electric circuit board is provided comprising a first electrically conductive member having a first and a second surface, having a first aperture with a first interior surface, and having a second aperture with a second interior surface; a dielectric material which is applied upon certain portions of the first and second surfaces, and which is applied upon the first interior surface within the first aperture; a first circuit assembly having a second electrically conductive member which is coupled to the dielectric material resident upon the first surface of the first electrically conductive member, the first circuit assembly further including a third electrically conductive member and a first core member which is contained between the second and the third electrically conductive members and which includes at least one air-bridge; and a second circuit assembly having a fourth electrically conductive member which is coupled to the dielectric material resident upon the second surface of the first electrically conductive member, the second circuit assembly further including a fifth electrically conductive member and a second core member which is contained between a fourth and fifth electrically conductive members and which includes at least one air-bridge, the second circuit assembly cooperating with the first circuit assembly and with the dielectric material and with the first electrically conductive member to form a multi-layer circuit board.

According to a second aspect of the present invention a circuit assembly is provided. The circuit assembly is made by the process of providing an electrically conductive core member having at least one selectively formed aperture within the core member; attaching a dielectric adhesive material upon the core member; providing at least one pre-circuit assembly having a second electrically conductive member; attaching the at least one pre-circuit assembly to the dielectric adhesive material which is disposed upon the core member; and selectively etching the second member effective to extend the at least one aperture through the second member and forming a circuit board assembly.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
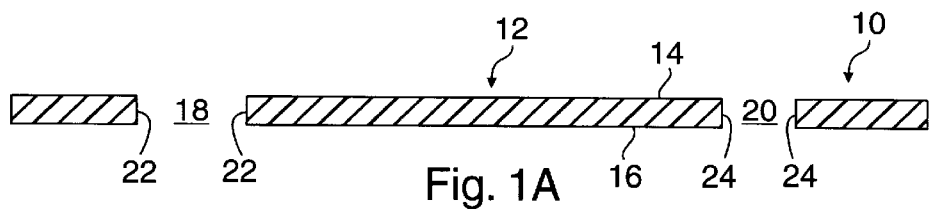
FIGS. 1(a)–(n) are successive sectional side views of a multi-layer circuit board being produced and/or formed in accordance with the teachings of the preferred embodiment of the invention.
Figure 1B:
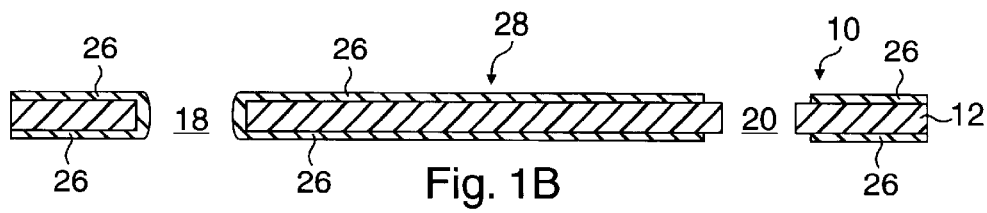
Figure 1C:
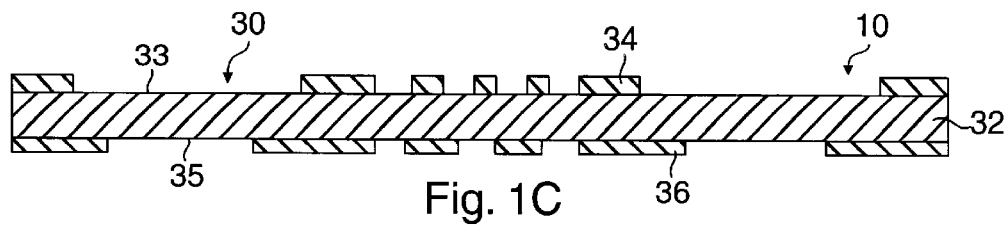
Figure 1D:
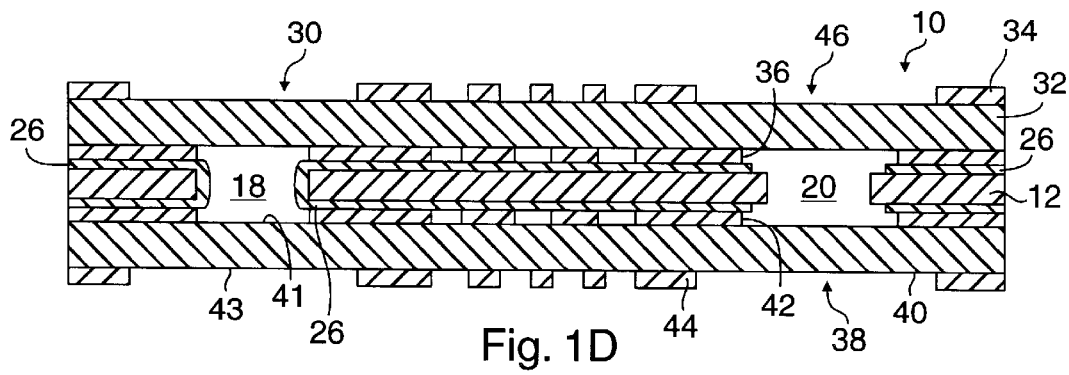
Figure 1E:
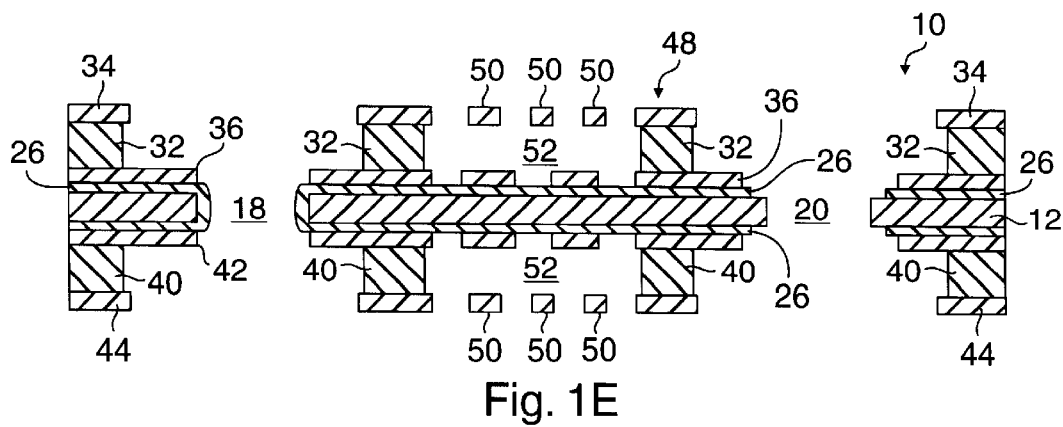
Figure 1F:
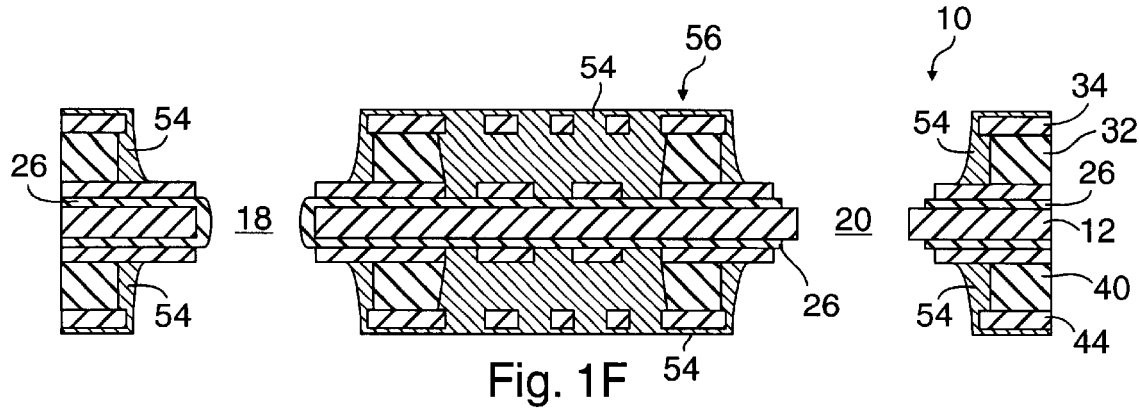
Figure 1G:
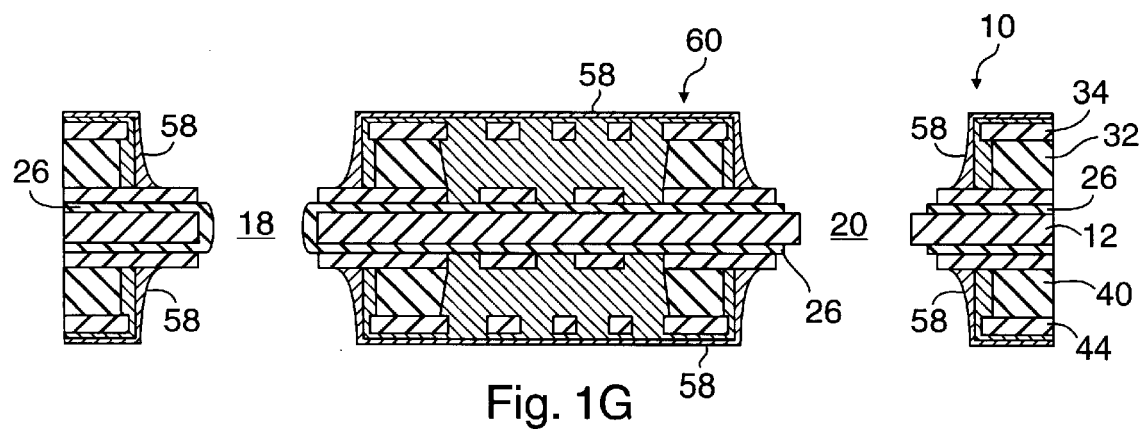
Figure 1H:
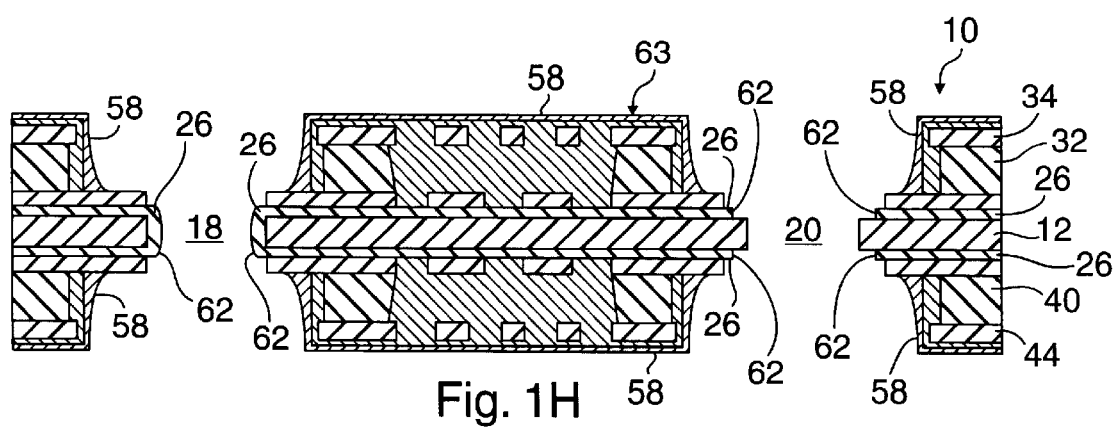
Figure 1I:
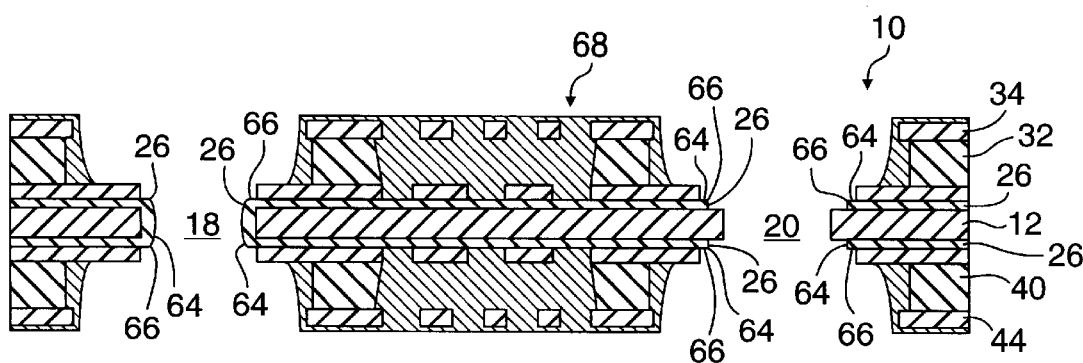
Figure 1J:
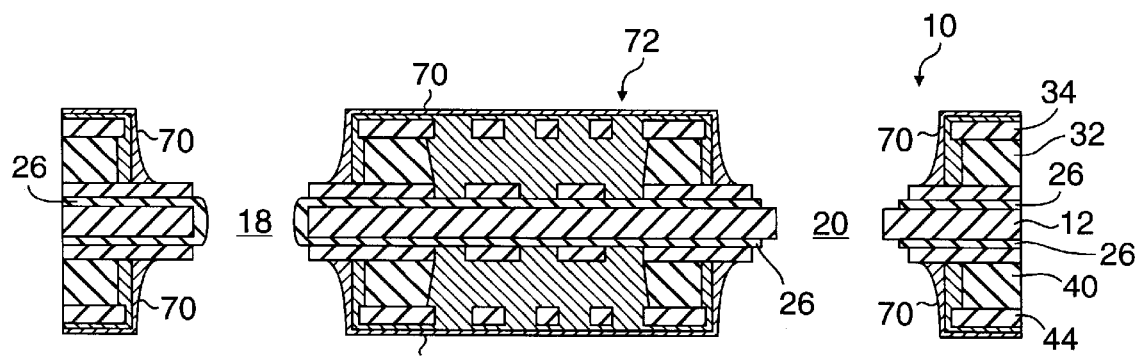
Figure 1K:
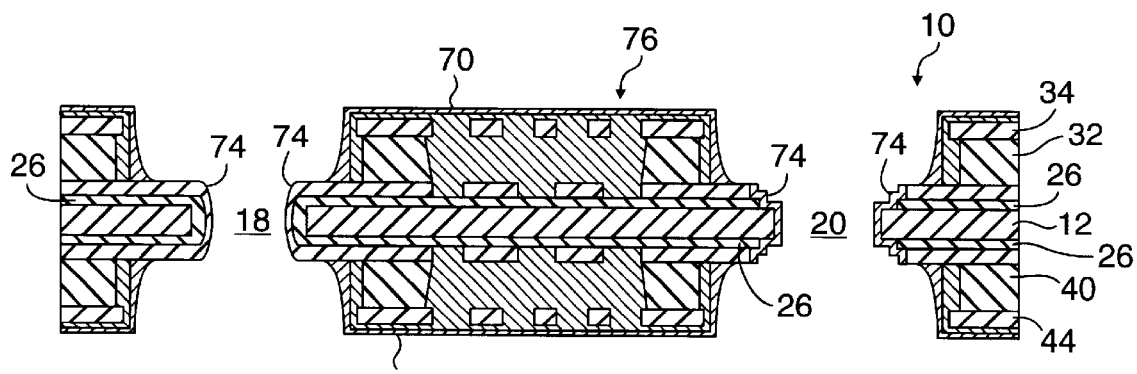
Figure 1L:
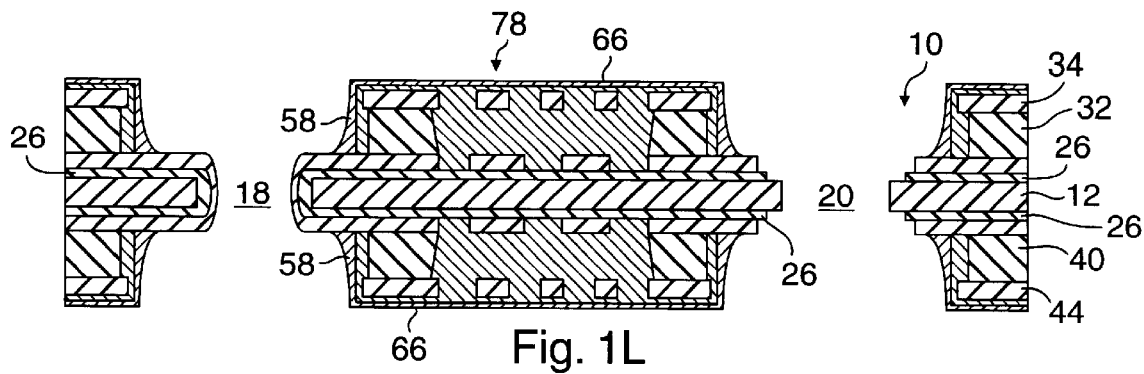
Figure 1M:
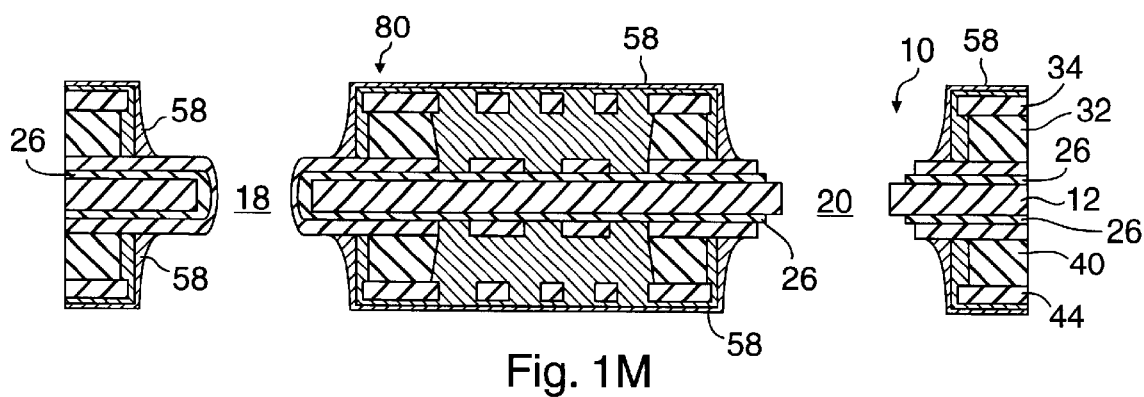
Figure 1N:
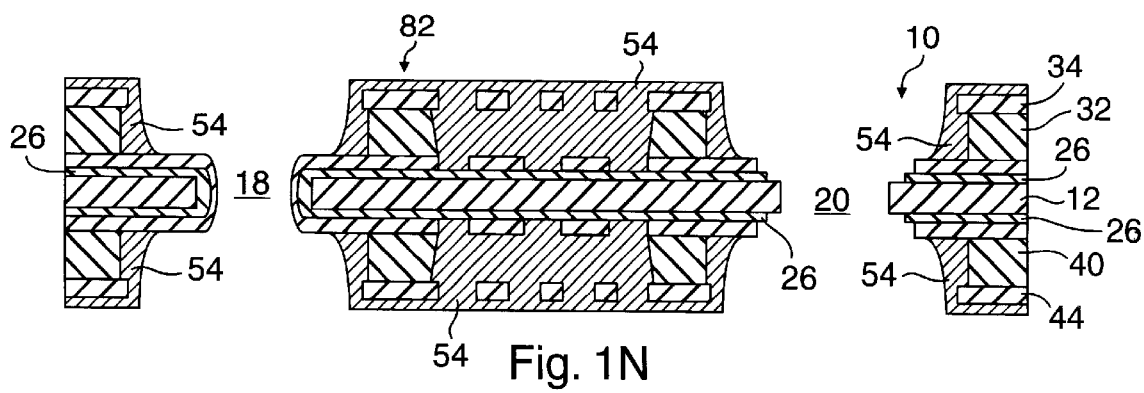

Referring now to FIGS. 1(a)–(n), there is shown a method and/or process 10 for selectively forming a multi-layer electronic circuit board in accordance with the teachings of the preferred embodiment of the invention. Specifically, as shown best in FIG. 1(a), the circuit board formation or creation process 10 begins with the acquisition of a member 12 having a top surface 14 and a bottom surface 16. Member 12 is selectively immersed in a conventional and commercially available etchant material, effective to create apertures and/or perforations 18, 20 through core member 12 having respective interior surfaces 22, 24 formed by portions of the member 12. In one non-limiting embodiment, member 12 comprises an electrically conductive member such as copper or some other electrically conductive metal. The selectively created apertures 18, 20 are therefore "metallized". That is, apertures 18, 20 are formed within metal core member 12 and therefore respectively contain and/or include electrically conductive metal surfaces 22, 24. As will be further delineated below, apertures 18 and 20 cooperatively and selectively allow for the creation of a "vias" or "perforations" within the metal core member 12.

The second step of process 10, as shown best in FIG. 1(b), requires that a certain commercially available dielectric liquid adhesive material 26 be respectively placed upon substantially all of the top surface 14 of metal foil member 12, upon substantially all portions of the bottom surface 16 of metal foil member 12, and upon aperture surface 22 by a conventional process, thereby creating pre-circuit assembly 28. Surface 24 and those portions of respective surfaces 14, 16 proximate to aperture 20 do not receive the material 26.

In the third step of process 10, as shown best in FIG. 1(c), a pre-circuit assembly 30 is provided and/or created. Particularly, pre-circuit assembly 30 includes a core member 32 having certain portions 34 and 36 respectively disposed upon the top and bottom surfaces 33, 35. In one non-limiting embodiment of the invention, core portion 32 comprises a conventional and commercially available material such as aluminum. In a further non-limiting embodiment of the invention, members 34, 36 comprise a conventional and commercially available electrically conductive material such as copper. In yet a further non-limiting embodiment of the invention, member 32 may be encapsulatively contained within portions 34, 36 and some of these various portions may be selectively and etchably removed, in a known manner, to form the assembly 30.

As shown in FIG. 1(d), process 10 continues by providing a second pre-circuit assembly 38 which, in one non-limiting embodiment of the invention, is substantially similar to pre-circuit assembly 30. Particularly, pre-circuit assembly 38 includes a core portion 40 having certain portions 42 and 44 respectively disposed upon the top and bottom surfaces 41, 43. In one non-limiting embodiment of the invention, core portion 40 comprises a conventional and commercially available metal such as aluminum. In a further non-limiting embodiment of the invention, members 42, 44 comprise a conventional and commercially available electrically conductive material such as copper.

As further shown in FIG. 1(d), pre-circuit assembly 28 is selectively "grown" as additional layers are selectively added to the electronic circuit board assembly or pre-circuit assembly 28. That is, as shown in FIG. 1(d), process 10 continues by attaching pre-circuit assemblies 30, 38 to pre-circuit assembly 28, thereby forming pre-circuit assembly 46. Particularly, member 36 of pre-circuit assembly 30 is attached, connected, and/or otherwise coupled to material 26 residing upon the top surface 14 of member 12, and member 42 of pre-circuit assembly 38 is attached, connected, and/or otherwise coupled to the material 26 residing upon the bottom surface 16 of member 12. In this manner, members 32, 40 of pre-circuit assemblies 30, 38 cooperatively overlay apertures 18, 20, thereby forming pre-circuit assembly 46.

In the fifth step of the process 10, which is best shown in FIG. 1(e), pre-circuit assembly 46 is selectively immersed in a conventional and commercially available etchant material (e.g., an aluminum etchant material) which removes portions of members 32, 40 of each of pre-circuit assembly 30, 38, thereby creating pre-circuit assembly 48 having selectively formed air-bridges 50 and selectively formed cavities 52, and apertures 18, 20 which traverse the formed assembly 48 and, more particularly, through member 32 and members 40 of circuit assemblies 30, 38, thereby adding additional layers to the previously formed pre-circuit assembly 30 and lengthening the apertures 18, 20.

In the sixth step of process 10, as shown best in FIG. 1(f), a commercially available "solder mask" 54 is selectively applied to pre-circuit 48, substantially covering portions of members 32, 34, 36, 40, 42, and 44 and substantially filling cavities 52 within pre-circuit assembly 48, thereby operatively supporting air-bridges 50 and forming pre-circuit assembly 56. In one non-limiting embodiment of the invention, solder mask 54 is applied to pre-circuit assembly 48 by a conventional "screen print" process.

In the seventh step of process 10, as shown best in FIG. 1(g), a conventional and commercially available "plating resistant" material 58 is applied upon the previously deposited solder mask material 54, thereby forming pre-circuit assembly 60.

In the eighth step of process 10, as shown best in FIG. 1(h), a conventional "conditioner solution" 62 is applied to "condition" the exposed portions of material 26, thereby creating pre-circuit assembly 63. It should be understood that the application of conditioner solution 62 to material 26 creates "micro-holes" and/or "micro-apertures" within the surface of material 26, thereby allowing those portions of material 26 to be "conditioned" for "metallization".

In the ninth step of process 10, as shown best in FIG. 1(i), a certain substance or material 64 is applied to the "conditioned" portions of material 26 to "metallize" the conditioned adhesive. In one non-limiting embodiment of the invention, known and conventional "blackhole" metallization may be used to metallize portions 26. As further shown in FIG. 1(i), a "seed layer" of electrically conductive material 66 may then be applied to selective portions of pre-circuit assembly 63, thereby forming pre-circuit assembly 68. In one non-limiting embodiment of the invention, the electrically conductive material 66 applied as the "seed layer" comprises a conventional and commercially available electrically conductive material such as copper. In a further non-limiting embodiment of the invention, the electrically conductive material 66 may be applied by electroplating the electrically conductive material to the metallized portions of adhesive material 26. It should be understood that the "seed layer" of electrically conductive material 66 is applied to pre-circuit assembly 58 to substantially "build up" a layer of electrically conductive material which cooperatively allows for the electroplating of apertures 18, 20.

In the tenth step of process 10, as shown best in FIG. 1(j), a second layer of plating resistant material 70 is selectively applied to pre-circuit assembly 68, substantially and selectively overlaying portions of the "seed layer" of electrically conductive material 66 and the first layer of plating resistant material 58, thereby forming pre-circuit assembly 72.

In the eleventh step of process 10, as shown best in FIG. 1(k), a conventional and commercially available electrically conductive material 74 is applied upon interior portions of the pre-circuit assembly 68 bounding, defining, and/or residing within apertures 18, 20 and substantially overlaying the exposed areas of members 12, 36, 42 and material 26 within and/or proximate to apertures 18, 20, thereby forming pre-circuit assembly 76. In one non-limiting embodiment of the invention, the electrically conductive material 74 comprises a conventional and commercially available electrically conductive material such as copper. In a further non-limiting embodiment of the invention, the electrically conductive material 74 is applied by a conventional electroplating process.

In the twelfth step of process 10, as shown best in FIG. 1(l), the second layer of plating resistant material 70 is "stripped" or otherwise removed from pre-circuit assembly 74 by a conventional process, thereby creating pre-circuit assembly 78 and exposing the "seed layer" of electrically conductive material 66.

In the thirteenth step of process 10, as shown best in FIG. 1(m), a conventional and commercially available metal etchant (e.g., a copper etchant) is selectively applied to selective portions of pre-circuit assembly 78 so as to "etch" or otherwise remove exposed portions of the "seed layer" of electrically conductive material 66, thereby forming pre-circuit assembly 80 and substantially exposing the first layer of plating resistant material 58.

In the fourteenth step of process 10, as shown best in FIG. 1(n), the first layer of plating resistant material 58 is "stripped" or otherwise removed from pre-circuit assembly 80 by a conventional process, thereby substantially exposing the solder mask 54 and creating multi-layer circuit assembly 82 having at least one non-ground metal aperture or "via" 18 and an electrically grounded metal aperture or "via" 20 which are formed by a process which obviates the need for drilling.

Figure 6:
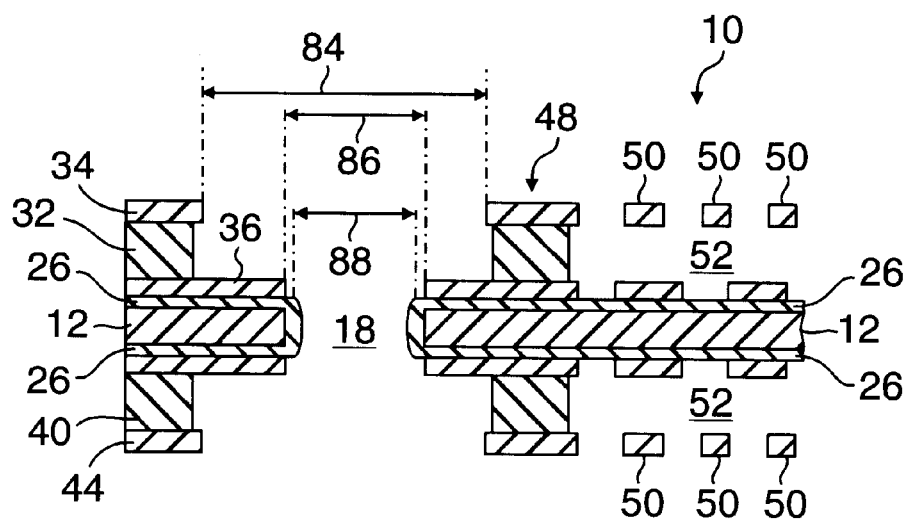
FIG. 6 is a side view of a first aperture formed by use of the process shown in FIGS. 1(a)–(n)
Figure 7:
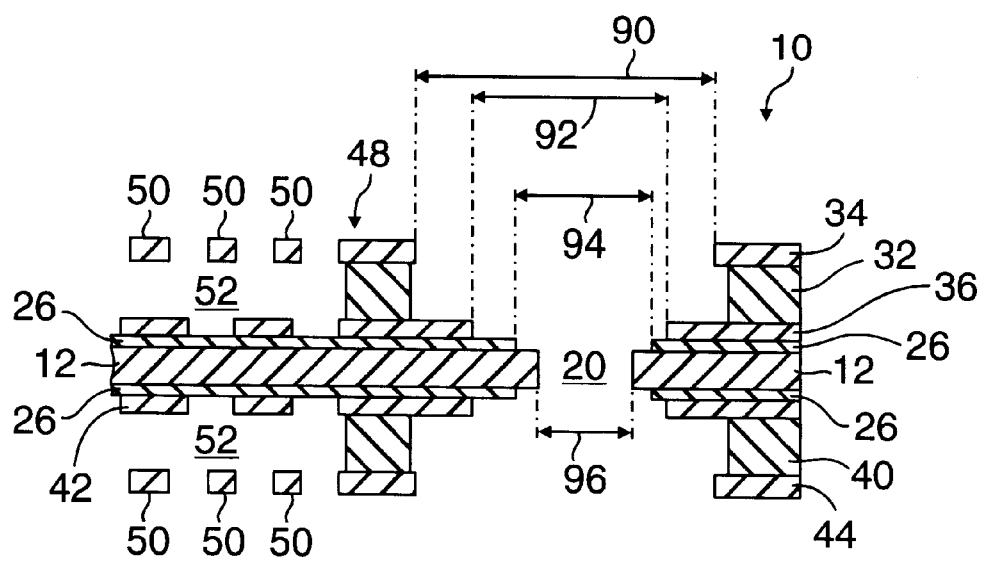
FIG. 7 is a side view of a second aperture formed by use of the process shown in FIGS. 1(a)–(n).

The structures of apertures 18, 20 of pre-circuit assembly 48 are shown best in FIG. 1(e), are respectively illustrated in FIGS. 6 and 7. As shown in FIG. 6, the width 86 of aperture 18 is about one hundred fifty micrometers to about one thousand micrometers. The width 88 of aperture 18 after adhesive material 26 is applied to member 12 is, without limitation, about ten micrometers to about fifteen micrometers. The width 84 of the portion of pre-circuit assembly 30 between members or portions 34 which reside above aperture 18 is about fifty micrometers to about one thousand micrometers larger than the aperture 86 before the adhesive material 26 is applied. It should be appreciated that this process 10 allows the aperture 18 to remain substantially free of solder mask material 54 and that this geometric configuration substantially prevents the layer or member 36 from entering aperture 18 and "overlapping" portion or member 26 due to a material placement misalignment. It should be appreciated that other dimensions and/or distances, other than those respectively set forth above, may be used in other non-limiting embodiments of the invention.

As shown best in FIG. 7, the width 96 of aperture 20 is about one hundred fifty micrometers to about one thousand micrometers. The width between portions of adhesive material 26 selectively placed on member 12 and on opposite sides of aperture 20 is about ten micrometers to about one hundred micrometers larger than the width 96 of aperture 20. The width 92, between members or portions 42 which reside upon opposite sides of aperture 20, is about fifty micrometers to about one hundred micrometers larger than the width 94. It should be appreciated that this process 10 and geometric arrangement substantially prevents the layer or members 36 and 42 from "overlapping" adhesive material 26 and entering aperture 20 due to a material placement misalignment. The width 90 between members or portions 34 which reside upon opposite sides of the aperture 20 is about fifty micrometers to about one thousand micrometers larger than the width 92. It should be appreciated that the present geometric configuration also substantially prevents portions of solder mask 54 and/or etch resistant materials 58, 70 from undesirably entering aperture 18 during the "screen printing" process.

Referring now to FIGS. 2(a)–(e), there is shown a method and/or process 110 for selectively forming a multi-layer electronic circuit board in accordance with the teachings of an alternate embodiment of the invention. Specifically, as shown best in FIG. 2(a), the circuit board formation or process 110 begins with the acquisition of a metal foil member or core member 112 having a top surface 114 and a bottom surface 116. Core member 112 is selectively immersed in a conventional and commercially available etchant material, effective to create apertures and/or perforations 118, 120 through core member 112 having respective interior surfaces 122, 124 bound by core member 112. The selectively created apertures 118, 120 are therefore "metallized". That is, apertures 118, 120 are formed within metal core member 112 and therefore are bounded or defined by the metal core member 112. In one non-limiting embodiment of the invention, member 112 is electrically conductive and generally rectangular in shape. In this non-limiting embodiment, metal foil 112 comprises a copper strip or foil and is substantially similar to metal foil 12 provided in the first process step of process 10. As will be further delineated below, apertures 118 and 120 cooperatively and selectively allow for the creation of a "vias" or "perforations" within the metal core member 112.

Figure 2A:
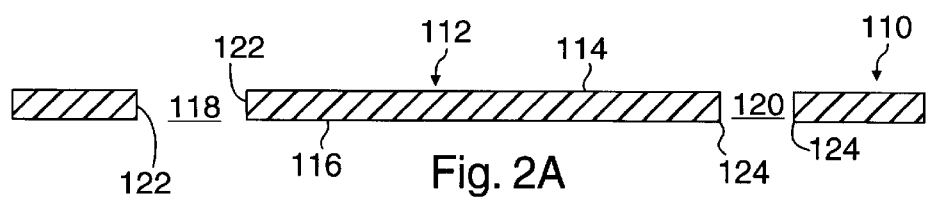
FIGS. 2(a)–(f) are successive sectional side views of a multi-layer circuit board being produced and/or formed in accordance with the teachings of a second embodiment of the invention.
Figure 2B:
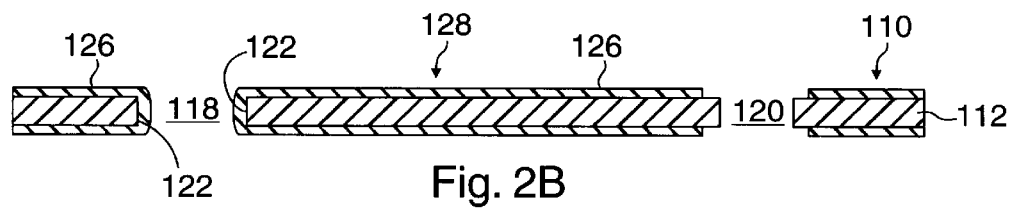

The second step of process 110, as shown best in FIG. 2(b), requires that a certain commercially available dielectric liquid adhesive material 126 be respectively placed upon certain portions of the top surface 114 of metal foil member 112, certain portions of the bottom surface 116 of metal foil member 112, and certain portions of interior surface 122 of aperture 118 within metal foil member 112 by a conventional process, thereby creating pre-circuit assembly 128. It should be understood that the presence of material 126 upon surface 122 within aperture 118 causes components, conductors, or any other type of electrical elements, which are selectively placed within aperture 118, to be "disconnected" from core metal portion 112, thereby forming a "via" which is disconnected from an electrical ground plane (e.g., in the event that portion 112 forms an electrical ground plane and is coupled to a ground potential). It should be further understood that surface 124 of aperture 120 remains exposed within aperture 120, allowing for the ground signal to be communicatively coupled to a component, conductor, or element residing within aperture 120 and contacting surface 124. Aperture 120 therefor forms a "grounded via".

Figure 2C:
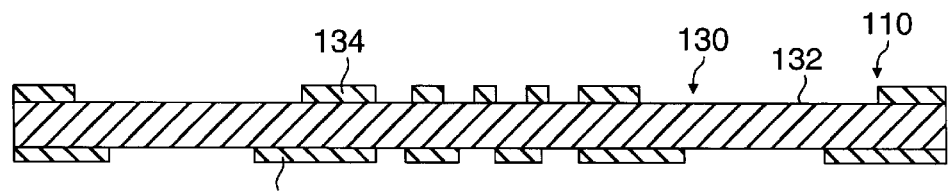

In the third step of process 110, as shown best in FIG. 2(c), a pre-circuit assembly 130 is provided. Particularly, pre-circuit assembly 130 includes a core portion 132 operatively contained between several top members 134 and several bottom members 136. In one non-limiting embodiment of the invention, core portion 132 comprises a conventional and commercially available metal such as aluminum. In a further non-limiting embodiment of the invention, members 134, 136 comprise a conventional and commercially available electrically conductive material such as copper. In a further non-limiting embodiment of the present invention, pre-circuit assembly 130 is formed by selectively immersing assembly 130 in a commercially available etchant material (e.g., a copper etchant material) which selectively removes portions of members 134, 136 of pre-circuit assembly 130, thereby allowing only a few of the members 134, 136 to remain coupled to the member 132.

Figure 2D:
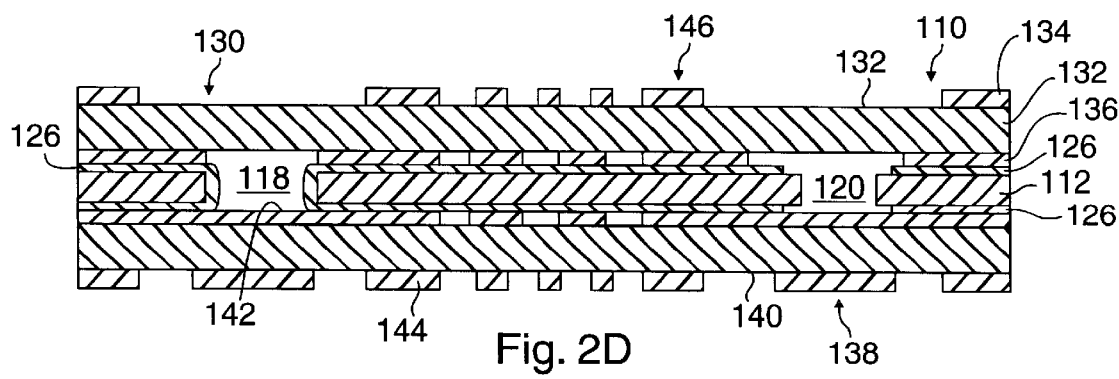

As shown in FIG. 2(d), process 110 continues by providing a second pre-circuit assembly 138. Pre-circuit assembly 138 includes a core portion 140 operatively contained between several top members 142 and several bottom members 144. In one non-limiting embodiment of the invention, core metal portion 140 comprises conventional and commercially available metal such as aluminum. In a further non-limiting embodiment of the invention, members 142, 144 each comprise a conventional and commercially available electrically conductive material such as copper. In a further non-limiting embodiment of the present invention, pre-circuit assembly 138 is selectively immersed in a commercially available etchant material (e.g., a copper etchant material) which allows only a few such members 142, 144 to remain attached to member 140.

As further shown in FIG. 2(d), pre-circuit assembly 128 is selectively "grown" as additional layers are selectively added to the electronic circuit board assembly or pre-circuit assembly 128. As further shown in FIG. 2(d), process 110 continues by attaching pre-circuit assemblies 130, 138 to pre-circuit assembly 128, thereby forming pre-circuit assembly 146. Particularly, members 136 of pre-circuit assembly 130 are attached, connected, and/or otherwise coupled to material 126 residing upon the top surface 114 of member 112, and member 142 of pre-circuit assembly 138 is attached, connected, and/or otherwise coupled to the material 126 residing upon the bottom surface 116 of member 112. In this manner, members 132, 142 of pre-circuit assemblies 130, 138 cooperatively overlay apertures 118, 120, thereby forming pre-circuit assembly 146.

Figure 2E:
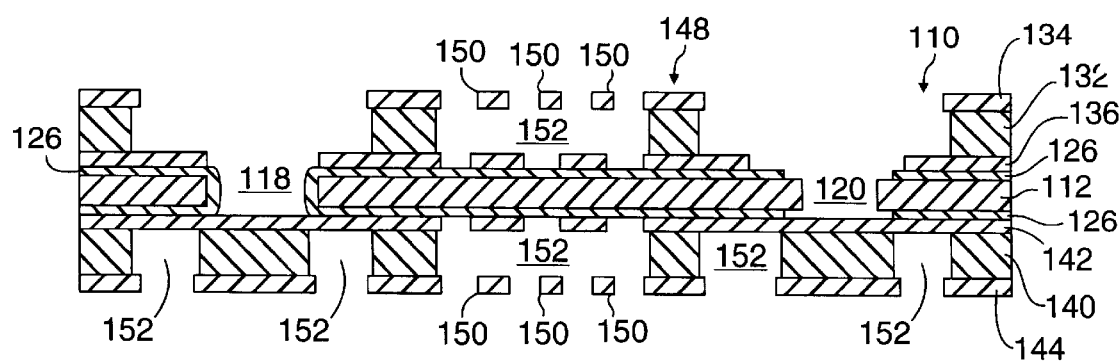

In the fifth step of the process 110, which is best shown in FIG. 2(e), pre-circuit assembly 146 is selectively immersed in a conventional and commercially available etchant material (e.g., an aluminum etchant material) which removes portions of members 132, 140 of pre-circuit assemblies 130, 138 thereby creating pre-circuit assembly 148 having selectively formed air-bridges 150 and selectively formed apertures or cavities 152. In this manner, apertures 118, 120 traverse through the formed pre-circuit assembly 130, and, more particularly through members 134, 132, and 136 of pre-circuit assembly 130, thereby adding additional layers to the previously formed pre-circuit assembly 130 and lengthening the apertures 118, 120, which terminate within pre-circuit assembly 148 upon unique regions or portions of member 144. In this manner, air-bridges 150 are "suspended" over cavities or apertures 152 within pre-circuit assembly 148.

Figure 2F:
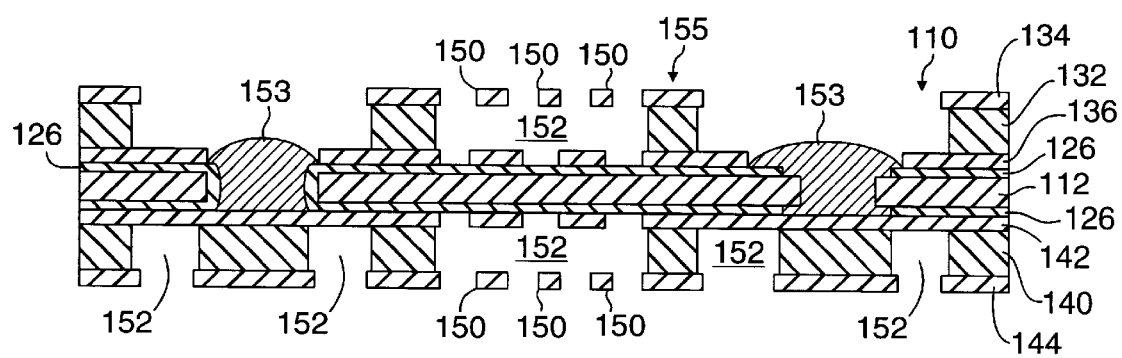

In the sixth step of process 110, as shown best in FIG. 2(f), a certain electrically conductive solder material 153 is selectively placed within the selectively extended apertures 118, 120, thereby forming electronic circuit board or circuit board assembly 155. It should be appreciated that assembly 155 may, in further non-limiting embodiments of the invention, be processed in such a manner which is effective to form various desired circuit board connection strategies.

Referring now to FIGS. 3(a)–(e), there is shown a method and/or a process 200 for selectively forming a multi-layer electronic circuit board, in accordance with the teachings of a third embodiment of the invention. Particularly, as is more fully delineated below, process 200 employs an adhesive material which is selectively coupled and/or applied to a core member and which is later subjected to a photo imaging process which causes the adhesive material to be configured and/or formed in a desired pattern, thereby allowing apertures to be selectively formed within the core member without drilling.

As shown, process 200 employs an electrically conductive metal foil and/or core member 202 which may comprise copper or some other conventional and commercially available metal and which is generally rectangular in shape. As shown best in FIG. 3(a), an etchable adhesive material 204 is applied to the top and the bottom surface 206, 208 of the electrically conductive core member 202. In one non-limiting embodiment, the etchable adhesive material 204 substantially covers the top and bottom surfaces 206, 208. Particularly, as should be apparent to those of ordinary skill in the art, material 204 may be "rolled", sprayed, and/or coated upon the surfaces 206, 208 or applied in a "film form" to these core member surfaces 206, 208.

Figure 3A:
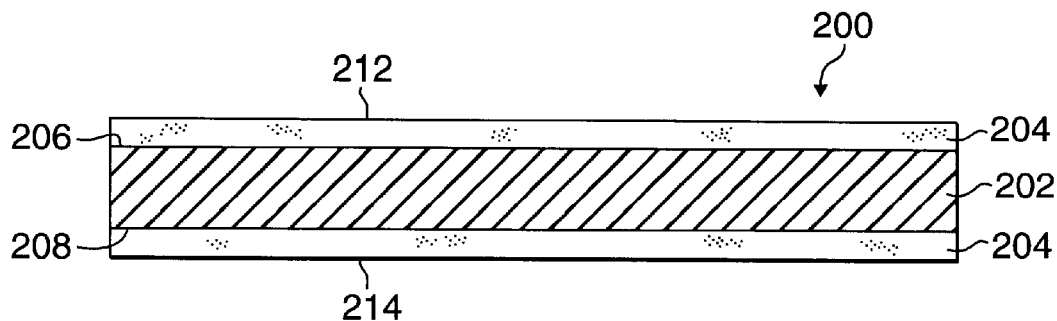
FIGS. 3(a)–(e) are successive sectional side views of a multi-layer circuit board being produced and/or formed in accordance with the teachings of a third embodiment of the invention.
Figure 3B:
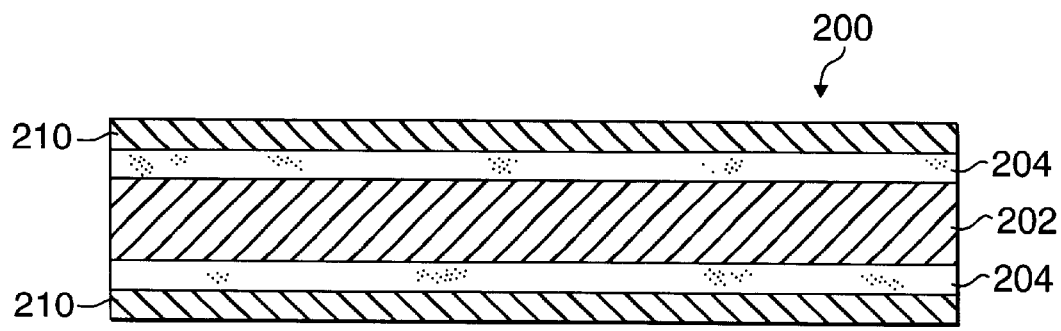

After the adhesive material 204 is applied to member 202 in the foregoing manner, the process 200 continues, as shown best in FIG. 3(b), with the step of applying a conventional and commercially available photo resistive material 210 upon the respective exposed surfaces 212, 214 of the applied adhesive material 204. In one non-limiting embodiment of the invention, the photo resistive material 210 substantially covers the top and bottom surfaces 206, 208.

Figure 3C:
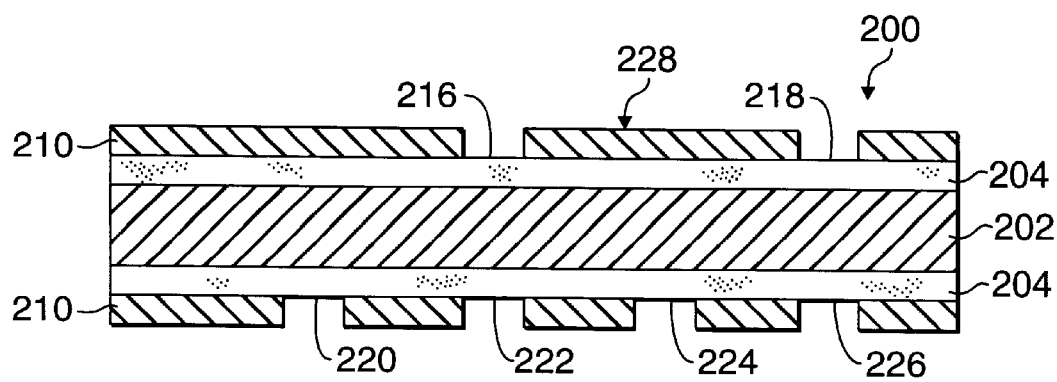

The previously applied photo resistive material 210 is then exposed and developed, in a known and conventional manner, to form exposed adhesive material portions of a selected and unique pattern. This pattern will vary depending upon the type of created circuit which is to be created and/or the type of application that the created circuit is to be used within. In one non-limiting embodiment, by way of example, and as best shown in FIG. 3(c), portions of the material 210 are removed and exposed top surface adhesive material portions 216, 218 and exposed bottom surface adhesive material portions 220, 222, 224, and 226, are concomitantly created, thereby creating a "pre-circuit" board or assembly 228. Portions 216 and 222 are aligned. That is, portion 222 is wholly contained under portion 216 and is substantially the same size and shape as portion 216. Portions 218 and 226 are similarly aligned.

Figure 3D:
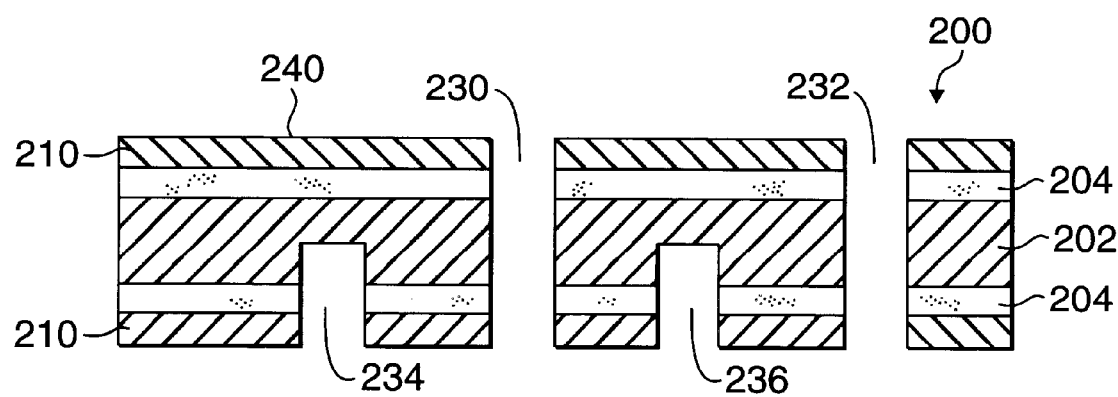

The fourth step of process 200 is shown best in FIG. 3(d) and, in this step, a second pre-circuit assembly 240 is created by subjecting pre-circuit assembly 228 to a commercially available etchant material which creates apertures through the exposed portions of the adhesive material 204. In this non-limiting example, apertures 230 and 232 are created. Particularly, aperture 230 extends through the aligned portions 218 and 226. Apertures 230, 232 traverse or extend through the core member 202 and the adhesive material 204 respectively residing upon surfaces 206, 208. The etchant material also creates recesses 234, 236 which extend through the adhesive material residing upon surface 208 but which terminate within the core member 202. Particularly, recesses 234, 236 respectively extend through portions 220, 224.

Figure 3E:
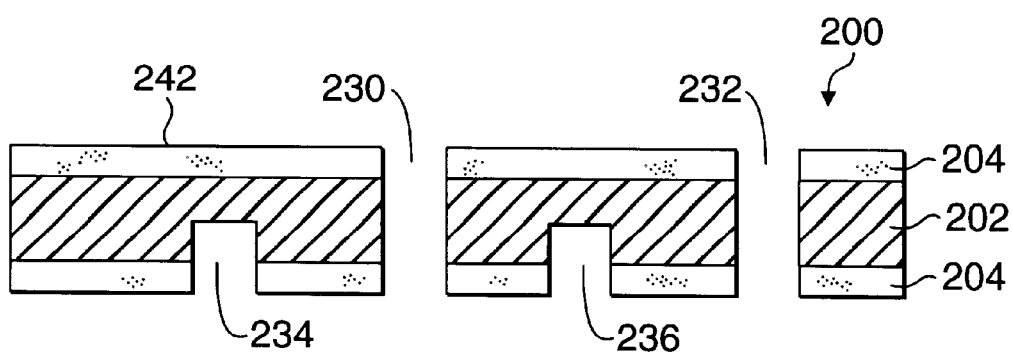

In the fifth step of process 200, which is shown best in FIG. 3(e), the photo resistive material 210 is removed from pre-circuit assembly 240 in a known manner, thereby creating a third pre-circuit assembly 242. Accordingly, pre-circuit assembly 242 may be further processed in accordance with the previously delineated steps of process 10 which are shown, for example and without limitation, in FIGS. 1(b), 1(c), 1(d), 1(e), 1(f), 1(g), 1(h), 1(i), 1(j), 1(k), 1(l), 1(m), and 1(n). Furthermore, pre-circuit assembly 242 may be further processed in accordance with the previously delineated steps of process 110 which are shown, for example and without limitation, in FIGS. 2(b), 2(c), 2(d), and 2(e), It should be realized that process 200, in this third non-limiting embodiment of the invention, allows for the creation of apertures 230, 232 and recesses 234, 236 without the need for drilling or screen printing, thereby providing for an overall relatively efficient and cost-effective circuit assembly process which produces a "pre-circuit board" assembly 242 which allows for the accurate and selective formation of conductive circuits or paths and, more particularly, for the accurate and selective formation of relatively thin conductive circuits or paths, thereby increasing the overall electronic circuit density of the created and/or produced circuit board assembly. It should also be apparent to those of ordinary skill in the art that apertures 230, by use of recesses 234, 236 may be isolated from an electrical ground potential which is applied to member 202 and that aperture 232 includes and/or is integrally formed with the portion of member 202 which is communicatively coupled to the electrical ground potential applied to member 212. Further, process 200 may be employed to create a wide variety of circuit boards and/or assemblies and that, in other circuit applications, adhesive material 204 and photo resistive material 210 may only be applied to one or a selective number or portion of one of the surfaces 206, 208, thereby allowing for the selective creation of a wide variety of circuit assemblies and configurations and allowing for the selective creation of several such "grounded" and "non-grounded" apertures.

Referring now to FIGS. 4(a)–(e) there is shown a circuit board and/or circuit board assembly creation process 250 which is made and/or undertaken in accordance with the teachings of a fourth embodiment of the invention. Particularly, as is more fully delineated below, process 250 requires the acquisition and/or creation of a core member 252 which is electrically conductive. In one non-limiting embodiment of the invention, core member 252 comprises copper or some other commercially available metal. Particularly, as is more fully delineated below, the core member 252 initially and selectively receives photo resistive material and is then subjected to a photo imaging process. The core member 252 is then made to selectively receive adhesive material and the adhesive material does not substantially "wet" the previously applied photo resistive material, thereby allowing a pattern of exposed core member regions to be created. Holes or apertures are then formed in the core member 252 by use of the exposed regions or portions in accordance with a certain desired circuit board/assembly configuration or a circuit board application requirement.

Figure 4A:
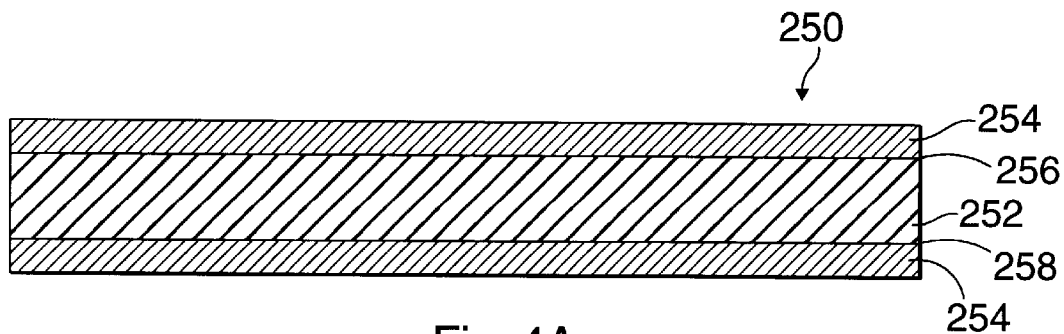
FIGS. 4(a)–(e) are successive sectional side views is of a multi-layer circuit board being produced and/or formed in accordance with the teachings of a fourth embodiment of the invention.

As shown best in FIG. 4(a), the first step of process 250 begins with the acquisition, creation, and/or use of a core and/or foil member 252 which, in one non-limiting embodiment of the invention, is substantially identical to member 202. As further shown in FIG. 4(a), a commercially available photo resistive material 254 is initially applied to the top and bottom surfaces 256, 258 of the core and/or foil member 252. In one non-limiting embodiment of the invention, material 254 is substantially identical to material 204 of process 200.

Figure 4B:
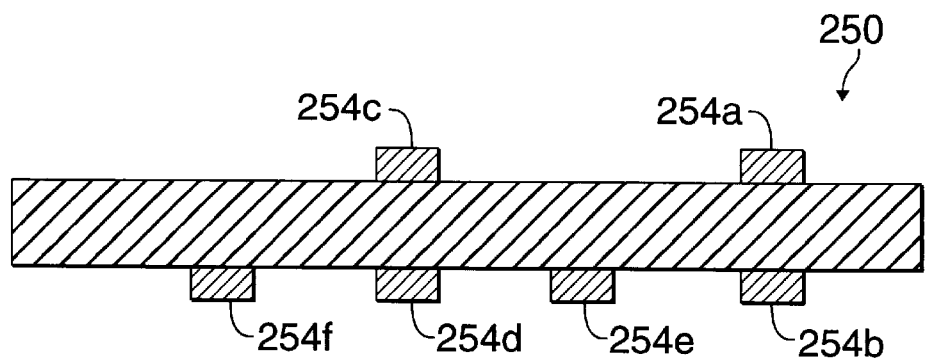

In the second step of process 250, which is best shown in FIG. 4(b), the applied photo resistive material 254 is selectively exposed, developed, and/or etched in a known manner, effective to remove most of the applied material 254 from the core member 252 and to allow the remaining material 254 to overlay only certain portions of surfaces 256, 258 in a particular and desired pattern. One non-limiting example of one such pattern is shown in FIG. 4(b). This non-limiting pattern is presented in order to exemplify certain features of this process 250 and should not limit the generality of this invention. Specifically, portions of material 254(a) and 254(b); and portions 254(c) and 254(d) are aligned. That is, portion 254(a) is substantially similar in size and shape to portion 254(b) and portion 254(b) wholly resides under portion 254(a) but upon an opposite surface of member 252 to the surface which portion 254(a) resides. Similarly, portion 254(c) is substantially similar in size and shape to portion 254(d) and portion 254(d) wholly resides under portion 254(c) but upon an opposite surface of member 252 to that which portion 254(c) resides. Aligned portions 254(a), 254(b); and 254(c), 254(d) cooperatively and respectively allow for the formation of "vias" or "through holes" in the created circuit assembly while those "non-aligned" portions of material 254 (e.g., portions 254(e) and 254(f)) only allow for the formation of recesses within the created circuit assembly, as shown below.

Figure 4C:
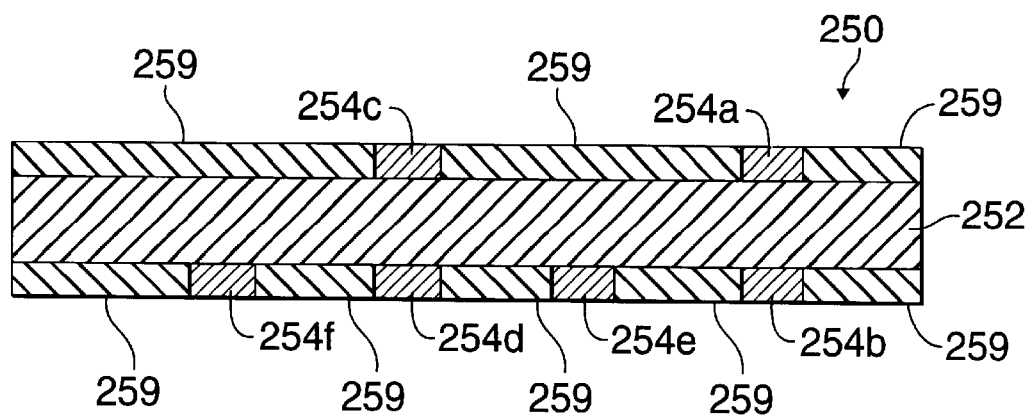

In the third step of process 250 which is best shown in FIG. 4(c), a substantially "non-wetting" or "dry" type of adhesive material 259 is applied to the exposed surfaces 256, 258 (i.e., to those surfaces which do not have and/or contain material 254). In one non-limiting embodiment of the invention, material 259 does not "wet" the surface of material 254 (e.g., the remaining portions 254(a)–254(f)), is relatively easily removable, and leaves relatively "clean" and relatively "sharp" edges. In addition, the material 259 substantially retains its desirable dielectric attributes and/or properties as the process 250 continues in a manner which is delineated below.

Figure 4D:
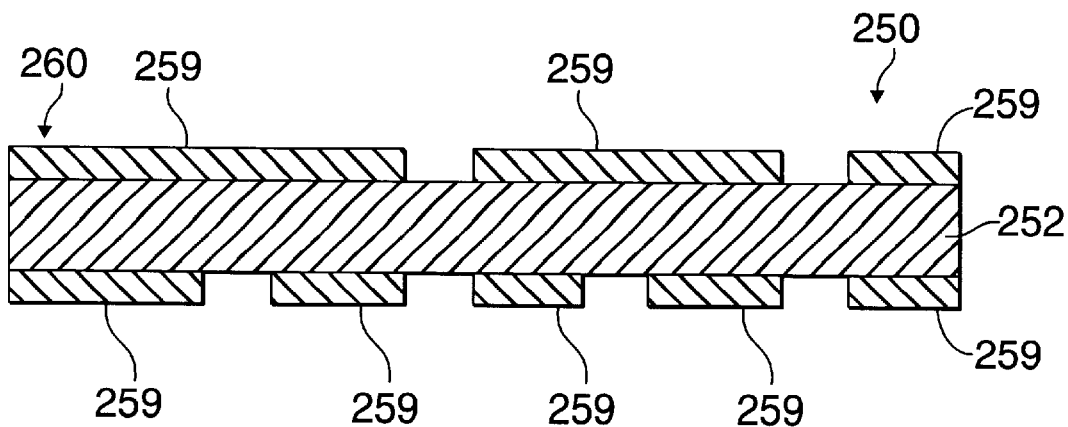
Figure 4E:
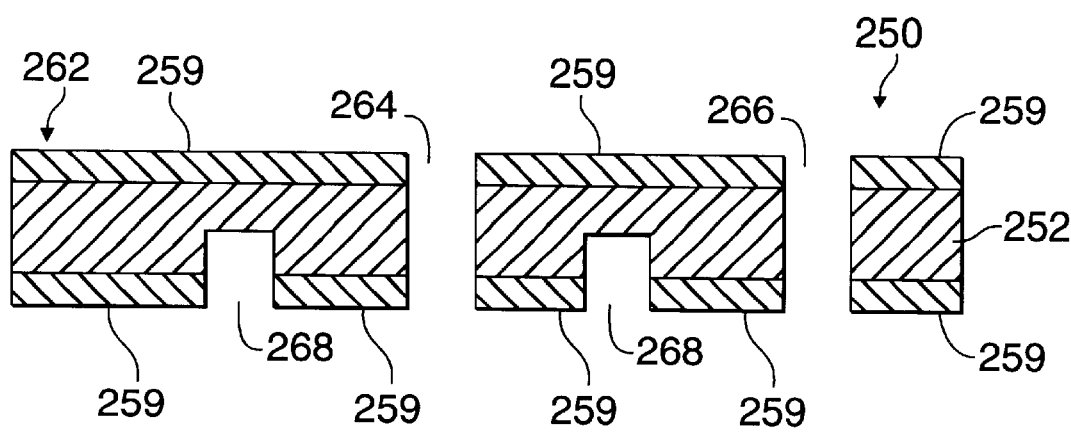

In the fourth step of process 250, as best shown in FIG. 4(d), the photo resistive material 254 (e.g., the remaining portions 254(a)–254(f)) is (are) "stripped away" by a known method, thereby creating a "pre-circuit" assembly 260. In the fifth step of process 250, the pre-circuit 260 is etched, thereby creating a pre-circuit assembly 262 having apertures 264, 266 respectively extending through the assembly 262 and, more particularly, through those respective portions of the "pre-circuit assembly" 262 previously occupied by aligned portions 254(c), 254(d); and 254(a), 254(b).

In one non-limiting embodiment of the invention, apertures 264, 266 respectively correspond to apertures 230, 232 of "pre-circuit" assembly or board 242. "Pre-circuit" assembly 262 further includes recesses 268, 270 which respectively occupy the space or position previously occupied by material portions 254(f) and 254(e), and which terminate within the core member 252 (e.g., extending into member 252 a distance equal to about one half of the width of the core member 252). These recesses 268, 270 respectively correspond to apertures 118, 120 of pre-circuit assembly 148 which is shown in FIG. 2(e) and which is formed within process 110.

It should be appreciated that process 250 allows for the selective creation of a "pre-circuit assembly" 262 having apertures 264, 266 which are formed without the use of screen printing or drilling. Moreover, these apertures 264, 266, by the use of formed recesses 268, 270, may be electrically grounded (e.g., portions of the member 252 residing within the aperture 266 may be communicatively coupled to a source of electrical ground potential) or non-grounded (e.g., portions of member 252 residing within the aperture 264 may be isolated from the source of electrical ground potential applied to certain other portions of member 252 by selectively extending the recesses 268, 270). It should be further appreciated that pre-circuit board or assembly 252 may be further subjected to the process steps shown in FIGS. 1(b), 1(c), 1(d), 1(e), 1(f), 1(g), 1(h), 1(i), 1(j), 1(k), 1(l), 1(m), and 1(n), and contained within and/or forming process 10. It should further be appreciated that pre-circuit 252 may be further subjected to the process steps shown in FIGS. 2(d) and 2(e) and contained within and/or forming process 110.

Figure 5A:
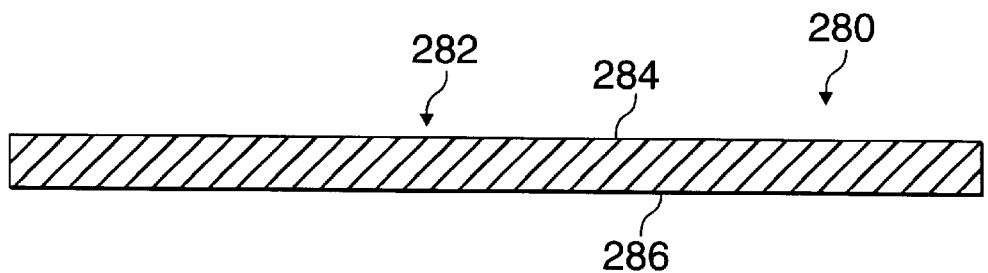
FIGS. 5(a)–(c) are successive sectional side views of a multi-layer circuit board being produced and/or formed in accordance with the teachings of a fifth embodiment of the invention.
Figure 5B:
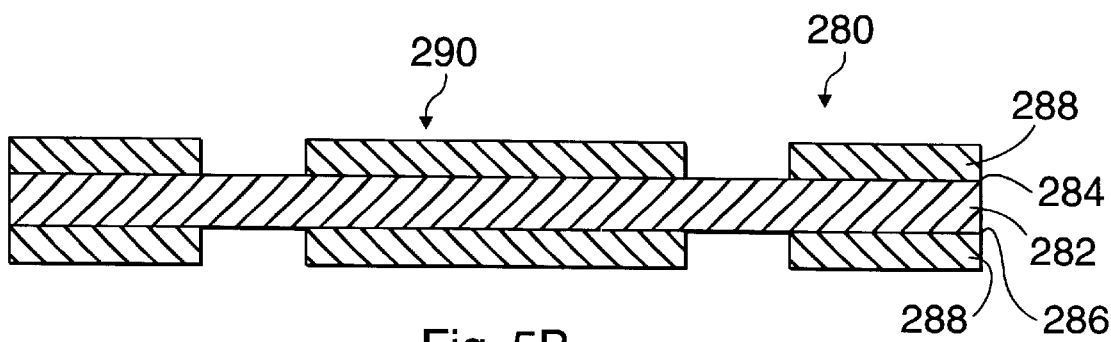
Figure 5C:
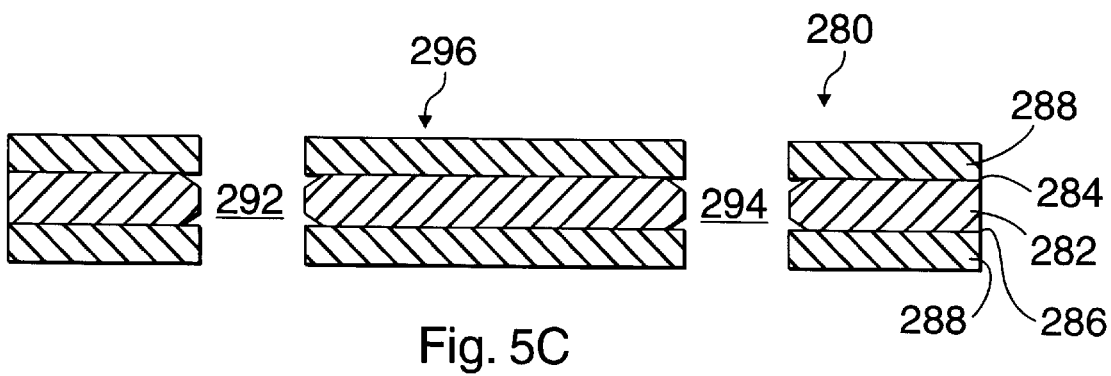

Referring now to FIGS. 5(a)–(c), there is shown a method and/or a process 280 for selectively forming a multi-layer electrical circuit board in accordance with the teachings of an alternate embodiment of the present invention. Specifically, as shown best in FIG. 5(a), the circuit board formation or creation process 280 begins with the acquisition of a core portion or member 282 having a top surface 284 and a bottom surface 286. In one non-limiting embodiment of the invention, member 282 comprises a conventional and commercially available electrically conductive material such as copper. In a further non-limiting embodiment of the invention, member or core portion 282 comprises a conventional and commercially available metal such as aluminum. In one non-limiting embodiment of the invention, member or core portion 282 is substantially similar to member 12 as shown in FIG. 1(d).

The second step of process 280, as shown best in FIG. 5(b), requires that a certain commercially available "photo imageable" layer of dielectric etch resistant material 288 be selectively applied to both the top surface 284 and the bottom surface 286 of core metal portion 282, thereby forming a pre-circuit assembly 290.

In the third step of process 280, as shown best in FIG. 5(c), the pre-circuit assembly 290 is selectively immersed in a conventional and commercially available etchant material, effective to create apertures and/or perforations 292, 294 within core metal portion 282, thereby forming pre-circuit assembly 296.

It should be appreciated that the pre-circuit assembly 296, as created by process 280, may be formed in a variety of shapes and sizes. It should be further appreciated that process 280 allows for the selective creation of a pre-circuit assembly 296 having apertures 292, 294 which are formed without the use of drilling. It should be further appreciated that pre-circuit assembly 296 may be further subjected to the process steps shown in FIGS. 1(b), 1(c), 1(d), 1(e), 1(f), 1(g), 1(h), 1(i), 1(j), 1(k), 1(l), 1(m), and 1(n). It should further be appreciated that pre-circuit assembly 296 may be further subjected to the process steps shown in FIGS. 2(b), 2(c), 2(d), and 2(e) and contained within and/or forming process 110.

It should be understood that the invention is not limited to the exact embodiment or construction which has been illustrated and described but that various changes may be made without departing from the spirit and the scope of the invention.

What is claimed is:

1. A method for making a circuit board comprising the steps of:

providing a member having a top and a bottom surface;

creating a first and a second aperture within said member;

applying a dielectric material upon certain portions of said top and bottom surfaces of said member and upon the portion of said first member residing within said first aperture;

providing at least one pre-circuit assembly having a core portion disposed between a top electrically conductive portion and a bottom electrically conductive portion;

connecting said at least one pre-circuit assembly to said dielectric material residing upon said top surface of said member; and selectively subjecting said core portion to an etchant material, effective to selectively remove certain portions of said core portion and effective to extend said first aperture and said second aperture, within said pre-circuit assembly, whereby a circuit board is formed having a first aperture and a second aperture and having at least one air-bridge.

2. The method of claim 1 wherein said member comprises an electric ground plane.

3. The method of claim 1 wherein said member and said first and said second electrically conductive members each comprise copper.

4. The method of claim 1 further comprising the step of placing supporting material under said at least one air-bridge.

5. The method of claim 1 wherein said step of providing said member comprises the steps of:

providing a third electrically conductive member having a first and a second surface;

placing a photo imageable layer of dielectric etch resistant material upon a certain portion of said first surface and a certain portion of said second surface; and etching said third electrically conductive member, thereby forming at least one aperture within said third electrically conductive member.

6. The method of claim 1 wherein said step of providing said member comprises the steps of:

providing a third electrically conductive member having a first and a second surface;

applying photo resistive material to said first and second surfaces;

removing a certain portion of said applied photo resistive material from said first and second surfaces;

applying a dry adhesive material to portions of said first and second surfaces; and etching said third electrically conductive member, effective to form at least one aperture within said third electrically conductive member.

7. The method of claim 1 wherein said step of providing said member comprises the steps of:

providing a third electrically conductive member having a first and a second surface;

applying an etchable adhesive material to said first and second surfaces;

applying a photo resistive material upon said etchable adhesive material;

selectively removing a first portion of said applied photo resistive material while allowing a second portion of said applied photo resistive material to remain upon said etchable adhesive material;

etching said third electrically conductive member, effective to form at least one aperture within said third electrically conductive member; and removing said second portion of said photo resistive material.

8. The method of claim 1 further comprising the step of electroplating the portion of said first member residing within said second aperture.

9. A method for making a circuit board assembly comprising the steps of:

providing a first member having a top and a bottom surface;

creating a first and a second aperture within said first member;

applying a dielectric material upon certain portions of said top and bottom surface of said first member and upon the portions of said first member residing within said first aperture;

providing a first pre-circuit assembly having a first core portion disposed between a first electrically conductive portion and a second electrically conductive portion;

providing a second pre-circuit assembly having a second core portion disposed between a third electrically conductive portion and a fourth electrically conductive portion;

connecting said first pre-circuit assembly to said dielectric material residing upon said top surface of said first member, effective to allow said first core portion to overlay said first and said second apertures;

connecting said second pre-circuit assembly to said dielectric material resident upon said bottom surface of said member, effective to allow said second core portion to overlay said first and said second apertures; and selectively subjecting said first and second core portions to an etchant material, effective to selectively remove certain portions of said first and second core portions, effective to extend said first and second apertures through said first pre-circuit assembly, thereby forming a circuit board having a first and a second aperture respectively terminating upon said third electrically conductive portion, at least one air-bridge within said first pre-circuit assembly, and at least one air-bridge within said second pre-circuit assembly.

10. The method of claim 9 wherein said first member comprises an electric ground plane.

11. The method of claim 9 wherein said step of providing said first member comprises the steps of:

providing a third electrically conductive member having a first and a second surface;

placing a photo imageable layer of dielectric etch resistant material upon a certain portion of said first surface and a certain portion of said second surface; and etching said third electrically conductive member, thereby forming at least one aperture within said third electrically conductive member.

12. The method of claim 9 wherein said step of providing said first member comprises the steps of:

providing a third electrically conductive member having a first and a second surface;

applying photo resistive material to said first and second surfaces;

removing a certain portion of said applied photo resistive material from said first and second surfaces;

applying dry adhesive material to portions of said first and second surfaces; and etching said third electrically conductive member, effective to form at least one aperture within said third electrically conductive member.

13. The method of claim 9 wherein said step of providing said first member comprises the steps of:

providing a third electrically conductive member having a first and a second surface;

applying an etchable adhesive material to said first and second surfaces;

applying a photo resistive material upon the etchable adhesive material;

selectively removing a first portion of said applied photo resistive material while allowing a second portion of said applied photo resistive material to remain upon said etchable adhesive material;

etching said third electrically conductive member, effective to form at least one aperture within said third electrically conductive member; and removing said second portion of said photo resistive material.

14. The method of claim 9 further comprising the step of placing supporting material under said at least one air-bridge.

15. The method of claim 9 further comprising the step of electroplating the portion of said first member residing within said second aperture.

* * * * *